United States Patent
Jang et al.

(10) Patent No.: US 8,713,415 B2
(45) Date of Patent: Apr. 29, 2014

(54) METHOD FOR GENERATING CODEWORDS

(75) Inventors: Ji Woong Jang, Anyang-si (KR); Seung Hee Han, Anyang-si (KR); Han Gyu Cho, Anyang-si (KR)

(73) Assignee: LG Electronics Inc., Seoul (KR)

( * ) Notice: Subject to any disclaimer, the term of this patent is extended or adjusted under 35 U.S.C. 154(b) by 76 days.

(21) Appl. No.: 13/581,197

(22) PCT Filed: Feb. 24, 2011

(86) PCT No.: PCT/KR2011/001302
§ 371 (c)(1),
(2), (4) Date: Aug. 24, 2012

(87) PCT Pub. No.: WO2011/105834
PCT Pub. Date: Sep. 1, 2011

(65) Prior Publication Data
US 2012/0319874 A1    Dec. 20, 2012

Related U.S. Application Data

(60) Provisional application No. 61/307,987, filed on Feb. 25, 2010, provisional application No. 61/312,664, filed on Mar. 10, 2010.

(51) Int. Cl.
*H03M 13/00* (2006.01)
(52) U.S. Cl.
USPC ............ 714/781; 370/335; 370/342
(58) Field of Classification Search
USPC ................. 714/781; 370/335, 342
See application file for complete search history.

(56) References Cited

U.S. PATENT DOCUMENTS

| 7,050,417 | B2 * | 5/2006 | Kim .......................... 370/342 |
| 2004/0103361 | A1 | 5/2004 | Lee et al. |
| 2005/0265293 | A1 | 12/2005 | Ro et al. |
| 2007/0277082 | A1 | 11/2007 | Matsumoto |
| 2011/0043391 | A1 | 2/2011 | Lee et al. |

FOREIGN PATENT DOCUMENTS

| JP | 4350750 B2 | 10/2009 |
| KR | 10-2009-0117580 A | 11/2009 |
| WO | 2005/107081 A1 | 11/2005 |

* cited by examiner

*Primary Examiner* — Sam Rizk
(74) *Attorney, Agent, or Firm* — Birch, Stewart, Kolasch & Birch, LLP (57) ABSTRACT

Provided is a method for generating codewords. The method comprises the following steps: receiving an information bit; generating a generating matrix in which a size of a column is identical with a length of the information bit, a size of a row is 24 rows, and values of symbols that are elements of the matrix are 0 or 1; modifying the generating matrix by dividing the generated generating matrix into an upper group and a lower group having an identical size and replacing rows so that the number of symbols having a value of 1 in the upper group is identical with the number of symbols having a value of 1 in the lower group; and obtaining inner products from the information bit and each row of the modified generating matrix and generating codewords from remainders obtained by dividing the inner products by 2.

12 Claims, 6 Drawing Sheets

METHOD FOR GENERATING CODEWORDS

CROSS REFERENCE TO RELATED APPLICATIONS

This application is the National Phase of PCT/KR2011/001302 filed on Feb. 24, 2011, which claims priority under 35 U.S.C. §119(e) to U.S. Provisional Application Nos. 61/307,987 filed on Feb. 25, 2010 and 61/312,664 filed on Mar. 10, 2010, all of which are hereby expressly incorporated by reference into the present application.

TECHNICAL FIELD

The present invention relates to the encoding of an information bit in a wireless communication system and, more particularly, to a method of generating codewords based on block encoding.

BACKGROUND ART

A standardization task for International Mobile Telecommunication (IMT)-Advanced, that is, the next-generation mobile communication system is recently in progress. IMT-Advanced sets its goal to support Internet Protocol (IP)-based multimedia service at a data transfer rate of 1 Gbps in stop and slow-speed moving states and of 500 Mbps in a fast-speed moving state.

$3^{rd}$ Generation Partnership Project (3GPP) is a system standard to satisfy the requirements of IMT-Advanced and is preparing for LTE-Advanced improved from Long Term Evolution (LTE) based on Orthogonal Frequency Division Multiple Access (OFDMA)/Single Carrier-Frequency Division Multiple Access (SC-FDMA) transmission schemes. LTE-Advanced is one of strong candidates for IMT-Advanced.

The next-generation wireless communication system requires a high-speed communication system capable of processing various pieces of information, such as video and wireless data and transmitting them. One of the most fundamental problems for achieving high-speed communication is how data can be transmitted through a channel efficiently and with reliability. In a wireless channel environment including wireless communication systems, unlike a wired channel environment, information is lost because inevitable errors are generated due to several factors, such as multi-path interference, shadowing, propagation attenuation, time-varying noise, interference, and fading.

Channel coding is a process of generating codewords by coding an information bit in order to prevent the loss of information. Here, the codeword refers to a bit stream generated by applying specific processing to an information bit in order to improve detection performance when transmitting the information bit.

Channel coding includes channel coding of a block form (hereinafter referred to as block coding) and channel coding of a Trellis form. The block coding is channel coding using a Bose-Chadhuri-Hocquenghem (BCH) code or a Reed-Muller (RM) code. A codeword in the block coding may be generated using a matrix block called a generating matrix. In the block coding, unlike in the channel coding of a Trellis form, there is noting relationship between front and rear blocks because there is no memory between consecutively generated blocks. The channel coding of a Trellis form is channel coding using a convolution code or a turbo code. A codeword in the channel coding of a Trellis form may be generated using a polynomial expression, such as a generating polynomial.

In LTE-A, a Transmit Format Combination Indicator (TFCI)) code is modified and used as a channel code for coding the channel information of an uplink control channel. The TFCI code is a code designed by puncturing an RM code, and it can simplify and speed up decoding through a fast Hamadard transform like an RM code because it may be considered as a modified RM code. Furthermore, the TFCI code is suitable for the requirements of channel information encoding because it supports various sizes of an information bit and codeword bits. Furthermore, the TFCI code can be used in the hardware of a dual mode system of Wideband Code Division Multiple Access (WCDMA) and LTE because it can use a decoder according to the 3GPP standard.

A generating matrix of a (20,10) TFCI code and a generating matrix of (18,10) code which are generated by puncturing a (32,10) TFCI code generating matrix are conventionally used. Here, the front digit within the parentheses is an index that indicates the length of a codeword, and the rear digit within the parentheses indicates the size of an information bit. However, there is a need for a generating matrix for supporting a channel code having an information bit of 24 because the channel code is recently required.

Furthermore, a process of calculating minimum distance performance between codewords after puncturing in a process of puncturing the generating matrix is very complicated. For example, in order to generate a generating matrix of a (a,A) RM code, specific A columns are selected, a generating matrix of a ($2^n$,A) RM code is generated, and x rows in the generating matrix are punctured. The number of cases in which x rows are randomly selected from $2^n$ rows when measuring minimum distance performance between codewords runs into astronomical figures (e.g., in the case of $2^n$=64 and x=16, $_{64}C_{16}$=488,526,937,079,580). Furthermore, to calculate a computational load and complexity in a process of calculating a minimum distance by generating a set of codewords of the (a,A) RM code according to the generating matrix and measuring the distance between all the codewords within the set in each of the cases is very difficult.

Accordingly, there is a need for a method of generating a generating matrix by searching for puncturing with a less computational load and effectively.

DISCLOSURE

Technical Problem

An object of the present invention is to generate codewords when an extended information bit is received. Furthermore, an object of the present invention is to generate a generating matrix by performing puncturing with a smaller computational load when generating a generating matrix for generating codewords.

Technical Solution

In an aspect, a method of generating codewords includes: receiving an information bit; generating a generating matrix in which a size of a column is identical with a length of the information bit, a size of a row is 24 rows, and values of symbols that are elements of the matrix are 0 or 1; modifying the generating matrix by dividing the generated generating matrix into an upper group and a lower group having an identical size and replacing rows so that the number of symbols having a value of 1 in the upper group is identical with the number of symbols having a value of 1 in the lower group; and obtaining inner products from the information bit and each row of the modified generating matrix and generating codewords from remainders obtained by dividing the inner products by 2.

The generating matrix may be modified by replacing the rows so that a difference between the number of symbols having the value of 1 in the upper group and the number of symbols having the value of 1 in the lower group becomes a minimum, if the rows are unable to be replaced so that the number of symbols having the value of 1 in the upper group is identical with the number of symbols having the value of 1 in the lower group.

The generating matrix may be modified by replacing the rows so that a symbol having a value of 0 does not consecutively occur in each column of the upper group and the lower group.

In another aspect, a method of generating codewords from an original generating matrix of a Reed-Muller (RM) code in which a length of a codeword is 2n includes: receiving an information bit; generating an optimal generating matrix in which a size of a column is identical with a length (y) of the information bit; generating a codeword by using the optimal generating matrix. The optimal generating matrix is generated by: calculating a division coefficient, wherein the division coefficient is a square (2y−1) of a difference between the length of the information bit of 2 and 1, calculating a puncturing coefficient ((2y−1)/(2n−a)) that is a ratio of the division coefficient and a difference between a length of a codeword of the RM code and a length of the generated codeword (a), and puncturing, when rows of the original generating matrix of the RM code are divided into identical sets equal to the division coefficient, specific columns of each of the sets by the puncturing coefficient.

The method may include: dividing the generated generating matrix into sets of rows of a first group and a second group which have an identical size, and modifying the generating matrix by replacing columns so that a number of symbols having a value of 1 in the first group is identical with a number of symbols having a value of 1 in the second group.

The generating matrix may be modified by replacing the columns so that a difference between the number of symbols having the value of 1 in the first group and the number of symbols having the value of 1 in the second group becomes a minimum, if the columns are unable to be replaced so that the number of symbols having the value of 1 in the first group is identical with the number of symbols having the value of 1 in the second group.

The generating matrix may be modified by replacing the columns so that a symbol having a value of 0 does not consecutively occur in each column of the first group and the second group.

The generating matrix may be modified by replacing the columns so that the columns belong to different symbols when transmitting a symbol having a consecutive value of 0, if a symbol having a value of 0 consecutively appears in each column of the first group and the second group.

Advantageous Effects

In accordance with the present invention, even when the length of an information bit is extended to 24 bits, a codeword having better minimum distance performance can be generated. Accordingly, symbols can be allocated to all the subcarriers of a slot in Long Term Evolution-Advanced (LTE-A).

Furthermore, a generating matrix for generating codewords can be generated with a smaller computational load.

MODE FOR INVENTION

The following technology may be used in a variety of wireless communication systems. The wireless communication systems can provide a variety of communication services, such as voice and packet data.

Figure 1:
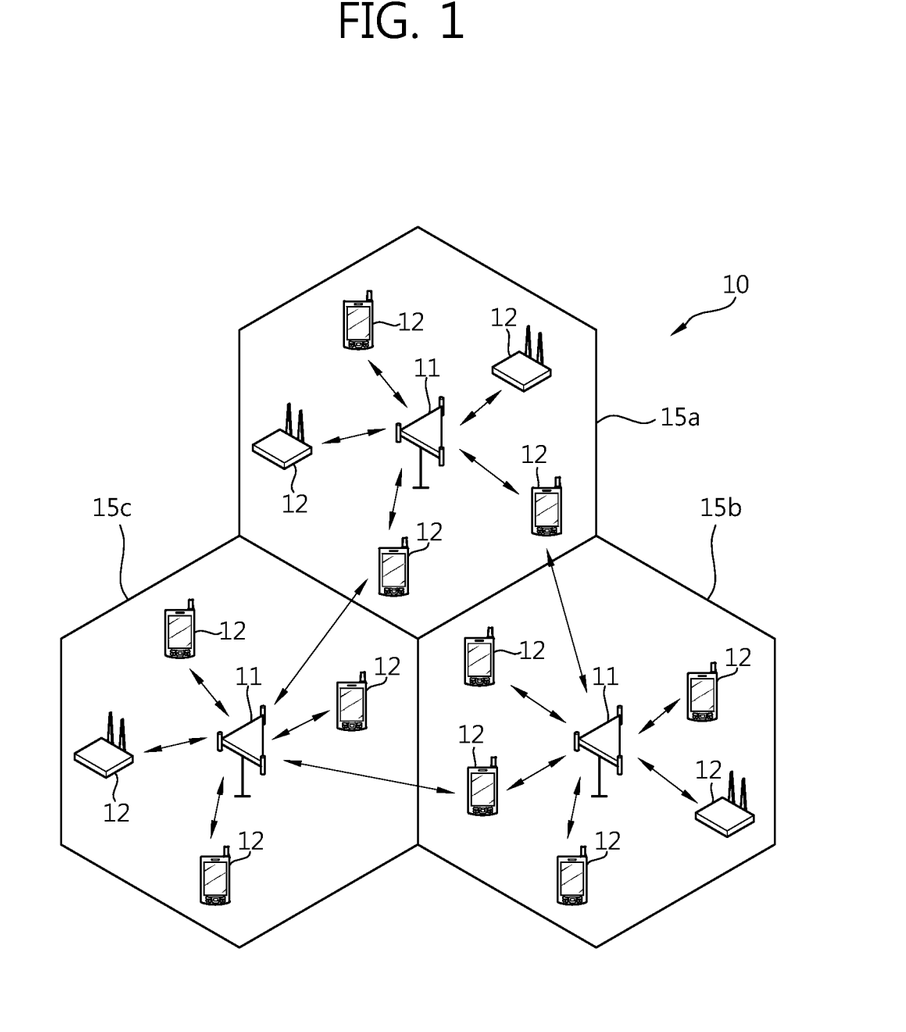
FIG. 1 shows a wireless communication system.

FIG. 1 shows a wireless communication system. The wireless communication system 10 includes at least one Base Stations (BS) 11. The BS 11 commonly refers to a fixed station that communicates with user equipments 12, and it may be called another terminology, such as an evolved NodeB (eNB), a Base Transceiver System (BTS), or an access point. The BSs 11 provide communication services to specific geographical areas (commonly called cells) 15a, 15b, and 15c. The cell may be subdivided into a plurality of areas (called sectors). The User Equipment (UE) 12 may be fixed or mobile and may be called another terminology, such as a Mobile Station (MS), a Mobile Terminal (MT), a User Terminal (UT), a Subscriber Station (SS), a wireless device, a Personal Digital Assistant (PDA), a wireless modem, or a handheld device.

Downlink refers to communication from a base station (BS) to user equipment (UE), and uplink refers to communication from UE to a BS. In downlink, a transmitter may be part of a BS, and a receiver may be part of UE. In uplink, a transmitter may be part of UE, and a receiver may be part of a BS.

Hereinafter, a process of generating codewords based on a Reed-Muller (RM) code is described. From among wireless communication systems, communication systems based on the RM code are being widely used. A description is given using the RM code. However, the present invention is not bounded to an RM code, and a Tail Biting Convolutional Code (TBCC), a turbo code, etc. may be used.

First, assuming that the size of a generating matrix G is 6×36, the generating matrix G may be represented by a basis sequence (or vector) $v_1$, $v_2$, $v_3$, $v_4$, $v_5$, and 1 that has 0 or 1 as an element as in Equation 1 below. Or, the generating matrix G may be represented by 1, $v_5$, $v_4$, $v_3$, $v_2$, and $v_1$ in which Equation 1 and order of a row are reversed. Here, the generating matrix refers to a matrix that becomes a basis for generating codewords. Each element of the generating matrix may be called a symbol, and the value of each symbol is 0 or 1. That is, it may be represented that the generating matrix includes 0 symbols or 1 symbols.

$$\begin{bmatrix} v_1 = (010101010101010101010101010101010101\ 1) \\ v_2 = (001100110011001100110011001100110011\ 1) \\ v_3 = (000011110000111100001111000011110000111\ 1) \\ v_4 = (000000001111111100000000011111111\ 1) \\ v_5 = (00000000000000001111111111111111\ 1) \end{bmatrix} = G_1 \quad \text{[Equation 1]}$$

$$[1 = (111111111111111111111111111111111111\ 1)] = G_0$$

An information bit m may be represented as in Equation 2 below. The length of an inputted information bit is 6 because the size of G has been assumed to be 6×36.

$$m = [m_1, m_2, m_3, m_4, m_5, m_0] = [M_1 | m_0] \quad \text{[Equation 2]}$$

Accordingly, a codeword b, that is, a result of a modulo operation of the multiplication of the information bit and the generating matrix G may be represented by Equation 3 below.

$$b = \left([M_1 \mid m_0]\left[\frac{G_1}{G_0}\right]\right)\bmod 2 = \quad \text{[Equation 3]}$$

$$(m_1 v_1 + m_2 v_2 + m_3 v_3 + m_4 v_4 + m_5 v_5 + m_6 1) \bmod 2$$

What the transmitted information bit is may be determined by decoding a specific transmission sequence called a generated codeword as described above. In a non-memory channel in which an error probability from one symbol to a next symbol is independent, a sequence is compared with all possible codewords and a codeword closest to the sequence is selected by taking reliability of received symbols into consideration.

Here, a different number of information bits between the received sequence and the codeword or a different number of information bits between codewords is called a distance. The smallest distance between the codewords is called a minimum distance because it is important in determining the performance of a code. For example, it is assumed that there are codewords 000, 010, and 110. A minimum distance is 1 because the distance between 000 and 110 is 2, the distance between 000 and 010 is 1, and the distance between 010 and 110 is 1. When the minimum distance of a specific block code is $d_{min}$, the codewords of the block code have different values in at least $d_{min}$ positions. This means that when errors of $d_{min}-1$ or less occur, a receiver may know that an error has occurred in a received signal and although errors of $(d_{min}-1)/2$ or less occur, a receiver can decode an original code without misunderstanding the original code as another codeword.

As the number of bits (the number of parity bits) added in a coding process increases, excellent detection performance may be obtained because the minimum distance may increase, but transmission efficiency may be lowered because too many bits are used in coding. Meanwhile, as the number of bits added in a coding process reduces, transmission efficiency may increase, but a minimum distance may decrease. As a result, the deterioration of performance may occur in a suddenly time-varying channel because detection performance is deteriorated and detection performance is determined sensitively to a difference in an error according to channel compensation. As described above, in the block coding, detection performance and transmission efficiency have a trade-off relation.

A method of generating another generating matrix by puncturing the generating matrix of a (32,10) RM code from among TFCI codes is described. The generating matrix of the (32,10) RM code may use a matrix provided by the 3GPP standard (refer to 5.2.2.6.4 of 3GPP TS36.212 V8.6.0). In particular, in order to generate Channel Quality Indication (CQI) information of a Physical Uplink Control Channel (PDCCH), a (20,10) RM generating matrix or an (18,10) RM generating matrix generated by puncturing the generating matrix of the (32,10) RM code may be used.

The (20,10) RM generating matrix and the (18,10) RM generating matrix may be generated by puncturing the (32, 10) RM generating matrix. Here, the (18,10) RM generating matrix may be generated by additionally puncturing two rows in the (20,10) RM generating matrix. Here, the (18,10) RM generating matrix does not have a quite different structure from the (20,10) RM generating matrix.

If this characteristic is used, the (18,10) RM generating matrix can be generated from the (32,10) RM generating matrix. When whole quality search is performed through computer simulations, puncturing results can be obtained as in Table 1 below.

TABLE 1

| i | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | Puncturing pattern (10, 20) | (18, 10) |
|---|---|---|---|---|---|---|---|---|---|---|---|---|
| 0 | 1 | 0 | 0 | 0 | 0 | 1 | 0 | 0 | 0 | 0 | | |
| 1 | 0 | 1 | 0 | 0 | 0 | 1 | 1 | 0 | 0 | 0 | Punctured | Punctured |
| 2 | 1 | 1 | 0 | 0 | 0 | 1 | 0 | 0 | 0 | 1 | | |
| 3 | 0 | 0 | 1 | 0 | 0 | 1 | 1 | 0 | 1 | 1 | | |
| 4 | 1 | 0 | 1 | 0 | 0 | 1 | 0 | 0 | 0 | 1 | Punctured | Punctured |
| 5 | 0 | 1 | 1 | 0 | 0 | 1 | 0 | 0 | 1 | 0 | | |
| 6 | 1 | 1 | 1 | 0 | 0 | 1 | 0 | 1 | 0 | 0 | | |
| 7 | 0 | 0 | 0 | 1 | 0 | 1 | 0 | 1 | 1 | 0 | Punctured | Punctured |
| 8 | 1 | 0 | 0 | 1 | 0 | 1 | 1 | 1 | 1 | 0 | | |
| 9 | 0 | 1 | 0 | 1 | 0 | 1 | 1 | 0 | 1 | 1 | | |
| 10 | 1 | 1 | 0 | 1 | 0 | 1 | 0 | 0 | 1 | 1 | Punctured | Punctured |
| 11 | 0 | 0 | 1 | 1 | 0 | 1 | 0 | 1 | 1 | 0 | | |
| 12 | 1 | 0 | 1 | 1 | 0 | 1 | 0 | 1 | 0 | 1 | | |
| 13 | 0 | 1 | 1 | 1 | 0 | 1 | 1 | 0 | 0 | 1 | | |
| 14 | 1 | 1 | 1 | 1 | 0 | 1 | 1 | 1 | 1 | 1 | Punctured | Punctured |
| 15 | 1 | 0 | 0 | 0 | 1 | 1 | 1 | 0 | 0 | 0 | Punctured | Punctured |
| 16 | 0 | 1 | 0 | 0 | 1 | 1 | 1 | 1 | 0 | 1 | | |
| 17 | 1 | 1 | 0 | 0 | 1 | 1 | 1 | 0 | 1 | 0 | | |
| 18 | 0 | 0 | 1 | 0 | 1 | 1 | 0 | 1 | 1 | 1 | | |
| 19 | 1 | 0 | 1 | 0 | 1 | 1 | 0 | 1 | 0 | 1 | | |
| 20 | 0 | 1 | 1 | 0 | 1 | 1 | 0 | 0 | 1 | 1 | Punctured | Punctured |
| 21 | 1 | 1 | 1 | 0 | 1 | 1 | 0 | 1 | 1 | 1 | Punctured | Punctured |
| 22 | 0 | 0 | 0 | 1 | 1 | 1 | 0 | 1 | 0 | 0 | | |
| 23 | 1 | 0 | 0 | 1 | 1 | 1 | 1 | 0 | 1 | | |
| 24 | 0 | 1 | 0 | 1 | 1 | 1 | 1 | 0 | 1 | 0 | Punctured | Punctured |
| 25 | 1 | 1 | 0 | 1 | 1 | 1 | 0 | 0 | 1 | | |
| 26 | 0 | 0 | 1 | 1 | 1 | 1 | 0 | 0 | 1 | 0 | | |
| 27 | 1 | 0 | 1 | 1 | 1 | 1 | 1 | 0 | 0 | | | Punctured |
| 28 | 0 | 1 | 1 | 1 | 1 | 1 | 1 | 1 | 1 | 0 | Punctured | Punctured |
| 29 | 1 | 1 | 1 | 1 | 1 | 1 | 1 | 1 | 1 | 1 | Punctured | Punctured |
| 30 | 0 | 0 | 0 | 0 | 0 | 1 | 0 | 0 | 0 | 0 | Punctured | Punctured |
| 31 | 0 | 0 | 0 | 0 | 1 | 1 | 1 | 0 | 0 | 0 | | Punctured |

Referring to Table 1, $M_{i,n}$ indicates a symbol that forms the generating matrix of the RM code in an $n^{th}$ column. As described above, each symbol refers to the element of the generating matrix and has a 1 or 0 value. i indicates an information bit. As in Equation 3 above, a codeword may be obtained using the remainder (modulo operation) obtained by performing an inner product on an information bit to each row of the generating matrix and dividing the result by 2.

The (20,10) RM generating matrix is obtained by puncturing 12 rows from the (32,10) RM generating matrix, and the (18,10) RM generating matrix is obtained by puncturing 2 rows from the (20,10) RM generating matrix additionally. In Table 1 above, a $27^{th}$ row and a $31^{st}$ row have been additionally punctured.

Table 2 below shows the minimum distance performance of the generated generating matrix.

TABLE 2

| | | | k | | | | |
|---|---|---|---|---|---|---|---|
| n | 4 | 5 | 6 | 7 | 8 | 9 | 10 |
| 20 | 8 | 8 | 8 | 6 | 6 | 6 | 6 |
| 18 | 8 | 6 | 6 | 5 | 5 | 4 | 4 |

Here, n indicates the number of bits after channel coding is performed, and k indicates the number of information bits.

Figure 2:
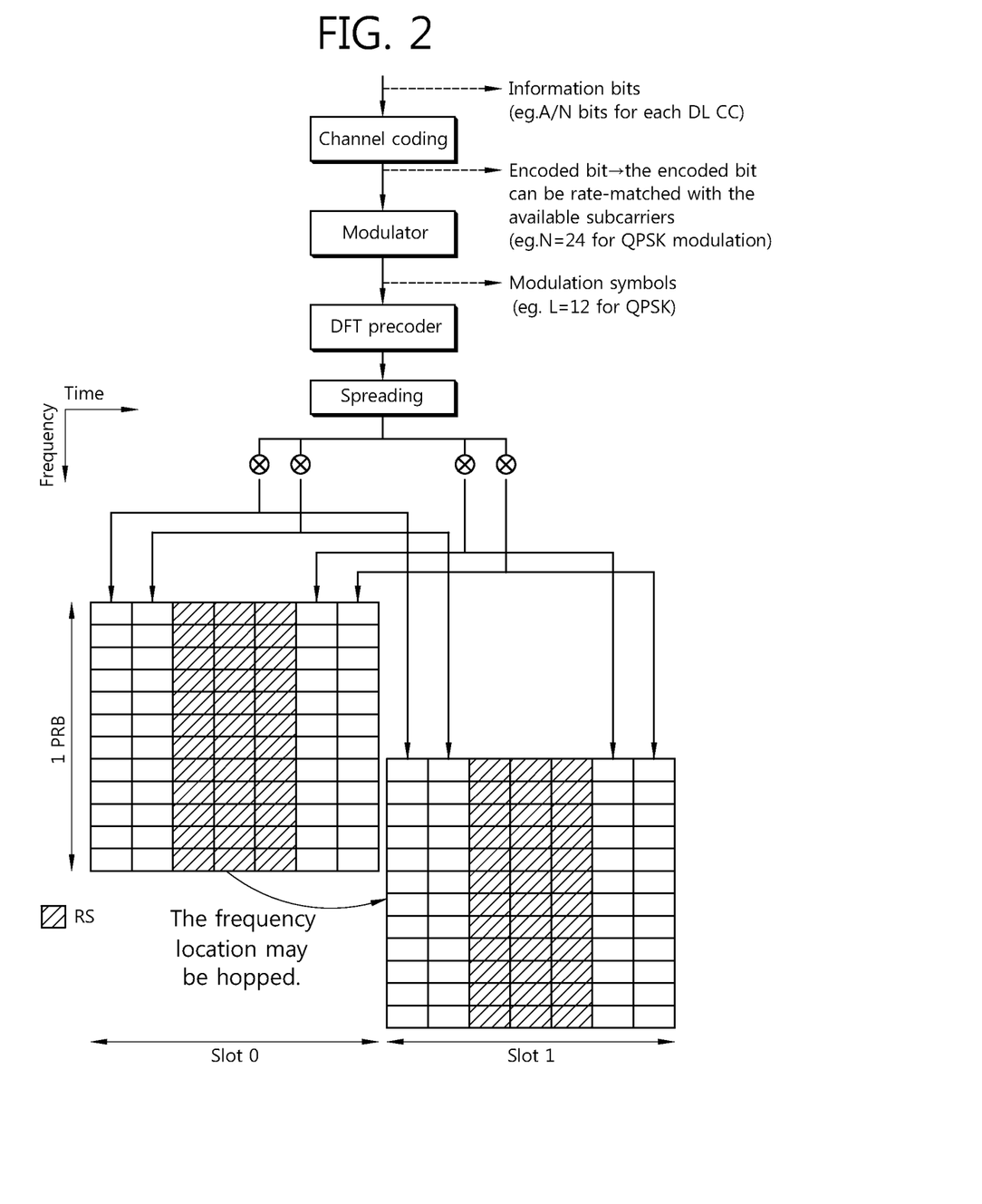
FIG. 2 shows a structure in which information is transmitted using channel coding in a 3GPP (LTE/LTE-A) uplink control channel system.

FIG. 2 shows a structure in which information is transmitted using channel coding in a 3GPP (LTE/LTE-A) uplink control channel system.

Referring to FIG. 2, when an information bit is received, encoded bits are generated through channel coding. A punctured RM code, a Tail Biting Convolutional Code (TBCC), or a turbo code may be used. The encoded bits may be subject to rate-matching with available subcarriers.

When the encoded bits are modulated using a modulator, such as a Binary Phase-Shift Keying (BPSK), a Quadrature Phase-Shift Keying (QPSK), 8 Phase-Shift Keying (8PSK), 16 Quadrature Amplitude Modulation (16QAM), or 64 Quadrature Amplitude Modulation (64QAM), modulation symbols are generated. The modulation symbols are spread into Walsh or DFT through a Discrete Fourier Transform (DFT) precoder.

In order to send information, each slot uses 12 subcarriers. In one subframe, two slots may be used at the same time. If two slots are used at the same time, 24 subcarriers are used. Accordingly, if BPSK modulation is used, 24 encoded bits are necessary. If QPSK modulation is used, 48 encoded bits are necessary. That is, a code having a length of at least 24 bits is necessary.

Meanwhile, in a generating matrix, consecutive 0s may generate a problem in that channel information is not contained in symbols at the time of QPSK transmission.

Table 3 below is an example showing a (20,13) RM generating matrix.

TABLE 3

| i | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ | $M_{i,11}$ | $M_{i,12}$ |
|---|---|---|---|---|---|---|---|---|---|---|---|---|---|
| 0 | 1 | 1 | 0 | 0 | 0 | 0 | 0 | 0 | 0 | 0 | 1 | 1 | 0 |
| 1 | 1 | 1 | 1 | 0 | 0 | 0 | 0 | 0 | 1 | 1 | 1 | 1 | 0 |
| 2 | 1 | 0 | 0 | 1 | 0 | 0 | 1 | 0 | 1 | 1 | 1 | 1 | 1 |
| 3 | 1 | 0 | 1 | 1 | 0 | 0 | 0 | 0 | 1 | 0 | 1 | 1 | 1 |
| 4 | 1 | 1 | 1 | 1 | 0 | 0 | 0 | 1 | 0 | 0 | 1 | 1 | 1 |
| 5 | 1 | 1 | 0 | 0 | 1 | 0 | 1 | 1 | 1 | 0 | 1 | 1 | 1 |
| 6 | 1 | 0 | 1 | 0 | 1 | 0 | 1 | 0 | 1 | 1 | 1 | 1 | 1 |
| 7 | 1 | 0 | 0 | 1 | 1 | 0 | 0 | 1 | 1 | 0 | 1 | 1 | 1 |
| 8 | 1 | 1 | 0 | 1 | 1 | 0 | 0 | 1 | 0 | 1 | 1 | 1 | 1 |
| 9 | 1 | 0 | 1 | 1 | 1 | 0 | 1 | 0 | 0 | 1 | 1 | 1 | 1 |
| 10 | 1 | 0 | 1 | 0 | 0 | 1 | 1 | 1 | 0 | 1 | 1 | 1 | 1 |
| 11 | 1 | 1 | 1 | 0 | 0 | 1 | 1 | 0 | 1 | 0 | 1 | 1 | 1 |
| 12 | 1 | 0 | 0 | 1 | 0 | 1 | 0 | 1 | 1 | 1 | 1 | 1 | 1 |
| 13 | 1 | 1 | 0 | 1 | 0 | 1 | 0 | 1 | 0 | 1 | 1 | 1 | 1 |
| 14 | 1 | 0 | 0 | 0 | 1 | 1 | 0 | 1 | 0 | 0 | 1 | 0 | 1 |
| 15 | 1 | 1 | 0 | 0 | 1 | 1 | 1 | 0 | 1 | 1 | 1 | 0 | 1 |
| 16 | 1 | 1 | 1 | 0 | 1 | 1 | 1 | 0 | 0 | 1 | 0 | 1 | 1 |
| 17 | 1 | 0 | 0 | 1 | 1 | 1 | 0 | 0 | 1 | 0 | 0 | 1 | 1 |
| 18 | 1 | 1 | 0 | 1 | 1 | 1 | 1 | 1 | 0 | 0 | 0 | 0 | 0 |
| 19 | 1 | 0 | 0 | 0 | 0 | 1 | 1 | 0 | 0 | 0 | 0 | 0 | 0 |

Table 3 shows the (20,13) RM generating matrix, which becomes the (20,10) RM generating matrix if the last 3 columns are deleted.

It can be seen that consecutive 0s appear frequently. In particular, in the case of $M_{i,5}$, that is, a sixth column, half the rows from the first row to the tenth row of the generating matrix are 0 without including 1. Thus, it corresponds to that information is transmitted only one slot according to channel conditions even though transmission is performed using two slots. If sequences are not distinguished from one another for each sequence bit in this sequence, performance cannot be guaranteed. In particular, performance is deteriorated because receive diversity for a sixth input data bit is not obtained. Accordingly, the substation of rows requires a method of generating codewords by properly performing the substation.

A method of generating codewords according to the present invention is described below. The generation of codewords according to the present invention may be performed in either a transmitter or a receiver.

Figure 3:
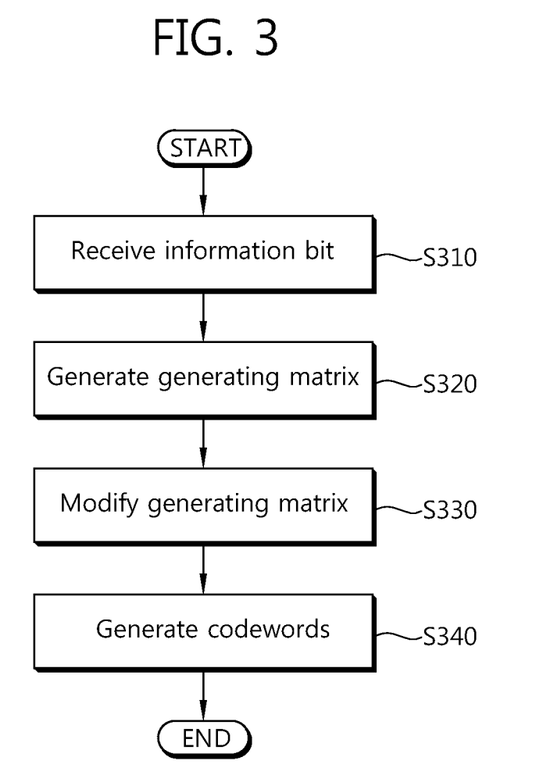
FIG. 3 is a flowchart illustrating a method of generating codewords according to the present invention.

FIG. 3 is a flowchart illustrating a method of generating codewords according to the present invention.

First, an information bit is received (s310). A generating matrix is generated based on the length of the received information bit (s320). The generating matrix is generated so that the size of the column of the generating matrix is identical with the length of the information bit and the size of the row thereof becomes 24 rows. The generated generating matrix is modified by performing row replacement on the generated generating matrix so that consecutive 0s are placed in the generating matrix in order to prevent 0 symbols from occurring when transmitting information and transmission information has diversity (S330). The generation of the generating matrix and the modification of the generating matrix through row replacement are described later.

Codewords are generated from the remainders obtained by performing the inner product on the information bit and each of the columns of the generated generating matrix and dividing the results by 2 (s340). That is, the codewords are generated by listing the results of the modulo operation on the scalar product value.

This may be represented by Equation 4 below.

$$b_i = \sum_{n=0}^{O-1} (o_n \cdot M_{i,n}) \bmod 2 \quad \text{[Equation 4]}$$

where $i = 0, 1, 2, \ldots, B-1$

Here, $b_i$ is a codeword, O is the length of an information bit, $o_n$ is a received information bit, $M_{i,n}$ indicates a $n^{th}$ column of the generating matrix, and i indicates 24 rows of the generating matrix. B is 24, that is, the size of a row.

The generating matrix used to generate the codewords is a (24,A) RM generating matrix in which four rows are added to the existing (20,10) RM generating matrix and columns equal to the length A of the information bit are selected. Here, the length A of the information bit may be any one of 1 to 6. The four rows newly added as compared with the (20,10) RM generating matrix include four rows that make best the minimum distance performance of the (24,A) RM generating matrix, from among 12 rows punctured in order to generate the (20,10) RM generating matrix from the existing (32,10) RM generating matrix.

Furthermore, the size of the information bit has been changed from 10 to A. Since A is a number of 6 or lower, a maximum of 6 columns are selected from the existing 10 columns. Here, in terms of the characteristics of an RM code, it has been known that zeroth (all one column) and first order RM codes have better performance than a secondary RM code. Since a TFCI code is generated from the RM code, the generating matrix may be generated by selecting one all one column and 5 columns from columns that form the first order RM code and thus selecting a total of 6 columns. This is identical with the support of the length of the information bit 1 to 6 of the existing (32,10) TFCI code. Thus, there is an advantage in that the existing TFCI decoder can be used by generating the (24,A) generating matrix using 1 to 6 columns of the (32,10) generating matrix. In particular, an extended generating matrix according to the present invention can be generated using 1 to 6 columns of a generating matrix that is used in the Physical Uplink Shared Channel (PUSCH) of the present LTE-A standard (Chapter 5.2.2.6.4 of 3GPP TS36.212 V8.6.0).

As described above, a new generating matrix can be generated by newly adding four rows while using the 0 to 19 rows of the (20,10) RM generating matrix.

The added rows are selected from a set of added rows that make optimal the minimum distance performance and distance distribution of codewords that are generated for the length of the information bit of 1 to 6. This may be obtained through computer simulations.

Table 4 to Table 9 below show embodiments of sets of rows which have minimum distance performance and optimal distance distribution through computer simulations.

Table 4 shows a comparison of an embodiment of the newly generated (24,6) RM generating matrix is compared with the (20,10) RM generating matrix and the (18,10) RM generating matrix.

TABLE 4

| | | | | | | | Puncturing pattern | | |
|---|---|---|---|---|---|---|---|---|---|
| i | $M_{i,0}$ | $M_{i,1}$ | $M_{i,2}$ | $M_{i,3}$ | $M_{i,4}$ | $M_{i,5}$ | (24, 6) | (20, 10) | (18, 10) |
| 0 | 1 | 1 | 0 | 0 | 0 | 0 | | | |
| 1 | 1 | 0 | 1 | 0 | 0 | 0 | Punctured | Punctured | Punctured |
| 2 | 1 | 1 | 1 | 0 | 0 | 0 | | | |
| 3 | 1 | 0 | 0 | 1 | 0 | 0 | | | |
| 4 | 1 | 1 | 0 | 1 | 0 | 0 | Punctured | Punctured | Punctured |
| 5 | 1 | 0 | 1 | 1 | 0 | 0 | | | |
| 6 | 1 | 1 | 1 | 1 | 0 | 0 | | | |
| 7 | 1 | 0 | 0 | 0 | 1 | 0 | Punctured | Punctured | Punctured |
| 8 | 1 | 1 | 0 | 0 | 1 | 0 | | | |
| 9 | 1 | 0 | 1 | 0 | 1 | 0 | | | |
| 10 | 1 | 1 | 1 | 0 | 1 | 0 | Punctured | Punctured | Punctured |
| 11 | 1 | 0 | 0 | 1 | 1 | 0 | | | |
| 12 | 1 | 1 | 0 | 1 | 1 | 0 | | | |
| 13 | 1 | 0 | 1 | 1 | 1 | 0 | | | |
| 14 | 1 | 1 | 1 | 1 | 1 | 0 | | Punctured | Punctured |
| 15 | 1 | 1 | 0 | 0 | 0 | 1 | Punctured | Punctured | Punctured |
| 16 | 1 | 0 | 1 | 0 | 0 | 1 | | | |
| 17 | 1 | 1 | 1 | 0 | 0 | 1 | | | |
| 18 | 1 | 0 | 0 | 1 | 0 | 1 | | | |
| 19 | 1 | 1 | 0 | 1 | 0 | 1 | | | |
| 20 | 1 | 0 | 1 | 1 | 0 | 1 | | Punctured | Punctured |
| 21 | 1 | 1 | 1 | 1 | 0 | 1 | | Punctured | Punctured |
| 22 | 1 | 0 | 0 | 0 | 1 | 1 | | | |
| 23 | 1 | 1 | 0 | 0 | 1 | 1 | | | |
| 24 | 1 | 0 | 1 | 0 | 1 | 1 | | Punctured | Punctured |
| 25 | 1 | 1 | 1 | 0 | 1 | 1 | | | |
| 26 | 1 | 0 | 0 | 1 | 1 | 1 | | | |
| 27 | 1 | 1 | 0 | 1 | 1 | 1 | | | Punctured |
| 28 | 1 | 0 | 1 | 1 | 1 | 1 | Punctured | Punctured | Punctured |
| 29 | 1 | 1 | 1 | 1 | 1 | 1 | Punctured | Punctured | Punctured |
| 30 | 1 | 0 | 0 | 0 | 0 | 0 | Punctured | Punctured | Punctured |
| 31 | 1 | 0 | 0 | 0 | 0 | 1 | | | Punctured |

Here, the (24,6) RM generating matrix further includes the 14th, 20th, 21st, and 24th rows of the (32,10) RM generating matrix as compared with the (20,10) RM generating matrix.

Table 5 shows the generated (24,6) RM generating matrix.

TABLE 5

| i | $M_{i,0}$ | $M_{i,1}$ | $M_{i,2}$ | $M_{i,3}$ | $M_{i,4}$ | $M_{i,5}$ |
|---|---|---|---|---|---|---|
| 0 | 1 | 1 | 0 | 0 | 0 | 0 |
| 1 | 1 | 1 | 1 | 0 | 0 | 0 |
| 2 | 1 | 0 | 0 | 1 | 0 | 0 |
| 3 | 1 | 0 | 1 | 1 | 0 | 0 |
| 4 | 1 | 1 | 1 | 1 | 0 | 0 |
| 5 | 1 | 1 | 0 | 0 | 1 | 0 |
| 6 | 1 | 0 | 1 | 0 | 1 | 0 |
| 7 | 1 | 0 | 0 | 1 | 1 | 0 |
| 8 | 1 | 1 | 0 | 1 | 1 | 0 |
| 9 | 1 | 0 | 1 | 1 | 1 | 0 |
| 10 | 1 | 1 | 1 | 1 | 1 | 0 |
| 11 | 1 | 0 | 1 | 0 | 0 | 1 |
| 12 | 1 | 1 | 1 | 0 | 0 | 1 |
| 13 | 1 | 0 | 0 | 1 | 0 | 1 |
| 14 | 1 | 1 | 0 | 1 | 0 | 1 |
| 15 | 1 | 0 | 1 | 1 | 0 | 1 |
| 16 | 1 | 1 | 1 | 1 | 0 | 1 |
| 17 | 1 | 0 | 0 | 0 | 1 | 1 |
| 18 | 1 | 1 | 0 | 0 | 1 | 1 |
| 19 | 1 | 0 | 1 | 0 | 1 | 1 |
| 20 | 1 | 1 | 1 | 0 | 1 | 1 |
| 21 | 1 | 0 | 0 | 1 | 1 | 1 |
| 22 | 1 | 1 | 0 | 1 | 1 | 1 |
| 23 | 1 | 0 | 0 | 0 | 0 | 1 |

Table 6 shows another example of a comparison of another example of the newly generated (24,6) RM generating matrix with the (20,10) RM generating matrix and the (18,10) RM generating matrix.

Here, the newly generated (24,6) RM generating matrix further includes the 14th, 20th, 24th and 29th rows of the (32, 10) RM generating matrix as compared with the (20,10) RM generating matrix. Table 7 shows the generated (24,6) RM generating matrix.

TABLE 7

| i | $M_{i,0}$ | $M_{i,1}$ | $M_{i,2}$ | $M_{i,3}$ | $M_{i,4}$ | $M_{i,5}$ |
|---|---|---|---|---|---|---|
| 0 | 1 | 1 | 0 | 0 | 0 | 0 |
| 1 | 1 | 1 | 1 | 0 | 0 | 0 |
| 2 | 1 | 0 | 0 | 1 | 0 | 0 |
| 3 | 1 | 0 | 1 | 1 | 0 | 0 |
| 4 | 1 | 1 | 1 | 1 | 0 | 0 |
| 5 | 1 | 1 | 0 | 0 | 1 | 0 |
| 6 | 1 | 0 | 1 | 0 | 1 | 0 |
| 7 | 1 | 0 | 0 | 1 | 1 | 0 |
| 8 | 1 | 1 | 0 | 1 | 1 | 0 |
| 9 | 1 | 0 | 1 | 1 | 1 | 0 |
| 10 | 1 | 1 | 1 | 1 | 1 | 0 |
| 11 | 1 | 0 | 1 | 0 | 0 | 1 |
| 12 | 1 | 1 | 1 | 0 | 0 | 1 |
| 13 | 1 | 0 | 0 | 1 | 0 | 1 |
| 14 | 1 | 1 | 0 | 1 | 0 | 1 |
| 15 | 1 | 0 | 1 | 1 | 0 | 1 |
| 16 | 1 | 0 | 0 | 0 | 1 | 1 |
| 17 | 1 | 1 | 0 | 0 | 1 | 1 |
| 18 | 1 | 0 | 1 | 0 | 1 | 1 |
| 19 | 1 | 1 | 1 | 0 | 1 | 1 |
| 20 | 1 | 0 | 0 | 1 | 1 | 1 |
| 21 | 1 | 1 | 0 | 1 | 1 | 1 |
| 22 | 1 | 1 | 1 | 1 | 1 | 1 |
| 23 | 1 | 0 | 0 | 0 | 0 | 1 |

TABLE 6

| i | $M_{i,0}$ | $M_{i,1}$ | $M_{i,2}$ | $M_{i,3}$ | $M_{i,4}$ | $M_{i,5}$ | Puncturing pattern (24, 6) | (20, 10) | (18, 10) |
|---|---|---|---|---|---|---|---|---|---|
| 0 | 1 | 1 | 0 | 0 | 0 | 0 | | | |
| 1 | 1 | 0 | 1 | 0 | 0 | 0 | Punctured | Punctured | Punctured |
| 2 | 1 | 1 | 1 | 0 | 0 | 0 | | | |
| 3 | 1 | 0 | 0 | 1 | 0 | 0 | | | |
| 4 | 1 | 1 | 0 | 1 | 0 | 0 | Punctured | Punctured | Punctured |
| 5 | 1 | 0 | 1 | 1 | 0 | 0 | | | |
| 6 | 1 | 1 | 1 | 1 | 0 | 0 | | | |
| 7 | 1 | 0 | 0 | 0 | 1 | 0 | Punctured | Punctured | Punctured |
| 8 | 1 | 1 | 0 | 0 | 1 | 0 | | | |
| 9 | 1 | 0 | 1 | 0 | 1 | 0 | | | |
| 10 | 1 | 1 | 1 | 0 | 1 | 0 | Punctured | Punctured | Punctured |
| 11 | 1 | 0 | 0 | 1 | 1 | 0 | | | |
| 12 | 1 | 1 | 0 | 1 | 1 | 0 | | | |
| 13 | 1 | 0 | 1 | 1 | 1 | 0 | | | |
| 14 | 1 | 1 | 1 | 1 | 1 | 0 | | Punctured | Punctured |
| 15 | 1 | 1 | 0 | 0 | 0 | 1 | Punctured | Punctured | Punctured |
| 16 | 1 | 0 | 1 | 0 | 0 | 1 | | | |
| 17 | 1 | 1 | 1 | 0 | 0 | 1 | | | |
| 18 | 1 | 0 | 0 | 1 | 0 | 1 | | | |
| 19 | 1 | 1 | 0 | 1 | 0 | 1 | | | |
| 20 | 1 | 0 | 1 | 1 | 0 | 1 | | Punctured | Punctured |
| 21 | 1 | 1 | 1 | 1 | 0 | 1 | Punctured | Punctured | Punctured |
| 22 | 1 | 0 | 0 | 0 | 1 | 1 | | | |
| 23 | 1 | 1 | 0 | 0 | 1 | 1 | | | |
| 24 | 1 | 0 | 1 | 0 | 1 | 1 | | Punctured | Punctured |
| 25 | 1 | 1 | 1 | 0 | 1 | 1 | | | |
| 26 | 1 | 0 | 0 | 1 | 1 | 1 | | | |
| 27 | 1 | 1 | 0 | 1 | 1 | 1 | | | Punctured |
| 28 | 1 | 0 | 1 | 1 | 1 | 1 | Punctured | Punctured | Punctured |
| 29 | 1 | 1 | 1 | 1 | 1 | 1 | | Punctured | Punctured |
| 30 | 1 | 0 | 0 | 0 | 0 | 0 | Punctured | Punctured | Punctured |
| 31 | 1 | 0 | 0 | 0 | 0 | 1 | | | Punctured |

Table 8 shows a comparison of another example of the newly generated (24,6) RM generating matrix with the (20, 10) RM generating matrix and the (18,10) RM generating matrix.

TABLE 8

| i | $M_{i,0}$ | $M_{i,1}$ | $M_{i,2}$ | $M_{i,3}$ | $M_{i,4}$ | $M_{i,5}$ | Puncturing pattern (24, 6) | (20, 10) | (18, 10) |
|---|---|---|---|---|---|---|---|---|---|
| 0 | 1 | 1 | 0 | 0 | 0 | 0 | | | |
| 1 | 1 | 0 | 1 | 0 | 0 | 0 | Punctured | Punctured | Punctured |
| 2 | 1 | 1 | 1 | 0 | 0 | 0 | | | |
| 3 | 1 | 0 | 0 | 1 | 0 | 0 | | | |
| 4 | 1 | 1 | 0 | 1 | 0 | 0 | Punctured | Punctured | Punctured |
| 5 | 1 | 0 | 1 | 1 | 0 | 0 | | | |
| 6 | 1 | 1 | 1 | 1 | 0 | 0 | | | |
| 7 | 1 | 0 | 0 | 0 | 1 | 0 | Punctured | Punctured | Punctured |
| 8 | 1 | 1 | 0 | 0 | 1 | 0 | | | |
| 9 | 1 | 0 | 1 | 0 | 1 | 0 | | | |
| 10 | 1 | 1 | 1 | 0 | 1 | 0 | Punctured | Punctured | Punctured |
| 11 | 1 | 0 | 0 | 1 | 1 | 0 | | | |
| 12 | 1 | 1 | 0 | 1 | 1 | 0 | | | |
| 13 | 1 | 0 | 1 | 1 | 1 | 0 | | | |
| 14 | 1 | 1 | 1 | 1 | 1 | 0 | | Punctured | Punctured |
| 15 | 1 | 1 | 0 | 0 | 0 | 1 | Punctured | Punctured | Punctured |
| 16 | 1 | 0 | 1 | 0 | 0 | 1 | | | |
| 17 | 1 | 1 | 1 | 0 | 0 | 1 | | | |
| 18 | 1 | 0 | 0 | 1 | 0 | 1 | | | |
| 19 | 1 | 1 | 0 | 1 | 0 | 1 | | | |
| 20 | 1 | 0 | 1 | 1 | 0 | 1 | Punctured | Punctured | Punctured |
| 21 | 1 | 1 | 1 | 1 | 0 | 1 | Punctured | Punctured | Punctured |
| 22 | 1 | 0 | 0 | 0 | 1 | 1 | | | |
| 23 | 1 | 1 | 0 | 0 | 1 | 1 | | | |
| 24 | 1 | 0 | 1 | 0 | 1 | 1 | | Punctured | Punctured |
| 25 | 1 | 1 | 1 | 0 | 1 | 1 | | | |
| 26 | 1 | 0 | 0 | 1 | 1 | 1 | | | |
| 27 | 1 | 1 | 0 | 1 | 1 | 1 | | | Punctured |
| 28 | 1 | 0 | 1 | 1 | 1 | 1 | | Punctured | Punctured |
| 29 | 1 | 1 | 1 | 1 | 1 | 1 | | Punctured | Punctured |
| 30 | 1 | 0 | 0 | 0 | 0 | 0 | Punctured | Punctured | Punctured |
| 31 | 1 | 0 | 0 | 0 | 0 | 1 | | | Punctured |

Here, the newly generated (24,6) RM generating matrix further includes the $14^{th}$, $24^{th}$, $28^{th}$, and $29^{th}$ rows of the (32,10) RM generating matrix as compared with the (20,10) RM generating matrix.

Table 9 shows the generated (24,6) RM generating matrix.

TABLE 9

| i | $M_{i,0}$ | $M_{i,1}$ | $M_{i,2}$ | $M_{i,3}$ | $M_{i,4}$ | $M_{i,5}$ |
|---|---|---|---|---|---|---|
| 0 | 1 | 1 | 0 | 0 | 0 | 0 |
| 1 | 1 | 1 | 1 | 0 | 0 | 0 |
| 2 | 1 | 0 | 0 | 1 | 0 | 0 |
| 3 | 1 | 0 | 1 | 1 | 0 | 0 |
| 4 | 1 | 1 | 1 | 1 | 0 | 0 |
| 5 | 1 | 1 | 0 | 0 | 1 | 0 |
| 6 | 1 | 0 | 1 | 0 | 1 | 0 |
| 7 | 1 | 0 | 0 | 1 | 1 | 0 |
| 8 | 1 | 1 | 0 | 1 | 1 | 0 |
| 9 | 1 | 0 | 1 | 1 | 1 | 0 |
| 10 | 1 | 1 | 1 | 1 | 1 | 0 |
| 11 | 1 | 0 | 1 | 0 | 0 | 1 |
| 12 | 1 | 1 | 1 | 0 | 0 | 1 |
| 13 | 1 | 0 | 0 | 1 | 0 | 1 |
| 14 | 1 | 1 | 0 | 1 | 0 | 1 |
| 15 | 1 | 0 | 0 | 0 | 1 | 1 |
| 16 | 1 | 1 | 0 | 0 | 1 | 1 |
| 17 | 1 | 0 | 1 | 0 | 1 | 1 |
| 18 | 1 | 1 | 1 | 0 | 1 | 1 |
| 19 | 1 | 0 | 0 | 1 | 1 | 1 |
| 20 | 1 | 1 | 0 | 1 | 1 | 1 |
| 21 | 1 | 0 | 1 | 1 | 1 | 1 |
| 22 | 1 | 1 | 1 | 1 | 1 | 1 |
| 23 | 1 | 0 | 0 | 0 | 0 | 1 |

The (24,A) RM code according to the present invention has been generated by a method of puncturing 8 rows in the (32,10) RM code generating matrix. The (24,A) RM code may be generated by a method of adding 4 rows in the existing (20,A) RM code generating matrix. Puncturing has been performed in the (20,A) RM code, but a new generating matrix may be generated by adding 4 rows that have not been punctured in the (24,A) RM code.

Likewise, the new generating matrix of a (24,A) RM code may be generated by adding 6 rows in the generating matrix of an (18,A) RM code.

The minimum distance performance of the above-described (24,A) RM code is as follows in Table 10.

TABLE 10

| | A | | | |
|---|---|---|---|---|
| | 3 | 4 | 5 | 6 |
| Minimum Distance | 12 | 11 | 10 | 10 |

If a range of A is 1~5, five generator matrices having the same performance are further generated. Here, sets of added rows in the generating matrix of the (20,A) RM code are {1, 14, 20,29}, {1,14,21,28}, {1,14,28,29}, {1,21,28,29}, and {20,21,24,29}. The sets may be obtained through computer simulations. They show the same performance as Table 4 to Table 6. Accordingly, an invention using the generator matrices of the (24,10) RM code to which the sets are added may become new embodiments.

as described above, the newly added rows may be inserted in a form in which they are interleaved into the existing table. Furthermore, for a structure compatible with a spherical legacy, the newly added rows may be added to the last of a generating matrix.

Furthermore, consecutive 0s may not be placed in the generating matrix by replacing the rows of the generating matrix so that the generation of 0 symbol is prevented when transmitting information and transmission information has diversity.

First, if a generating matrix is modified by performing this row replacement, the rows of the generating matrix of the (24,10) RM code are divided into an upper group and a lower group in each of which n rows (n may be 12) are placed so that the number of 1s belonging to each of the n rows is equal in all columns. If the number of 1s belonging to each of the n rows cannot become equal in all columns, the rows of the generating matrix are divided into two groups so that a difference between the numbers of 1s becomes a minimum. Second, the position or order of the rows is controlled so that 0 does not appear consecutively in all the columns in each of the divided groups. Third, if the appearance of consecutive 0s cannot be prevented, the position or order of rows is controlled so that consecutive 0s belong to different symbols when transmitting the consecutive 0s. That is, if "00", that is, consecutive 0s, are generated, the position of "00" is controlled so that the first 0 and the second 0 are divided into different modulated symbols and thus they belong to them because the modulated symbol is formed of a plurality of bits. Fourth, if all the three conditions cannot be satisfied, the rows are aligned again so that the number of consecutive 0s becomes a minimum.

Meanwhile, it is most ideal that symbols transmitted in each slot are repeated. If the symbols are subject to QPSK modulation and transmitted on 12 subcarriers, a maximum diversity can be obtained because all 24 encoded bits are transmitted. If symbols transmitted in each slot are reduced to 6, it is preferred that the mapping order of 12 symbols be controlled. For example, in order to prevent symbols including an encoded bit 0 from existing in the same slot consecutively, each slot may be mapped in an interleaved form. That is, an odd-numbered symbol is mapped to a first slot and an even-numbered symbol is mapped to a second slot, or the even-numbered symbol is mapped to the first slot and the odd-numbered symbol is mapped to the second slot.

Effects that codewords are generated using the generating matrix of a (24,A) code according to the present invention are as follows.

First, in LTE-A Acknowledgement (ACK)/Negative Acknowledgement (NACK) feedback, a symbol for all the subcarriers of a slot may be allocated. This succeeds to the structure of the existing (32,10) TFCI code. Thus, high-speed decoding through fast Hamadard transform is possible and a decoding computational load can be maintained low. This succeeds to the structure of the existing (32,10) TFCI code. Thus, there are advantages in that a decoder can be reused and thus hardware can be reduced in a system that supports WCDMA and LTE dual mode. Furthermore, performance through diversity can be improved by realigning the rows of a generating matrix for obviating 0 symbols.

A method of generating a generating matrix by searching for puncturing more effectively in a generating matrix generated using puncturing and generating codewords using the generated generating matrix is described. The puncturing search method may also be applied to the above method of generating codewords.

Figure 4:
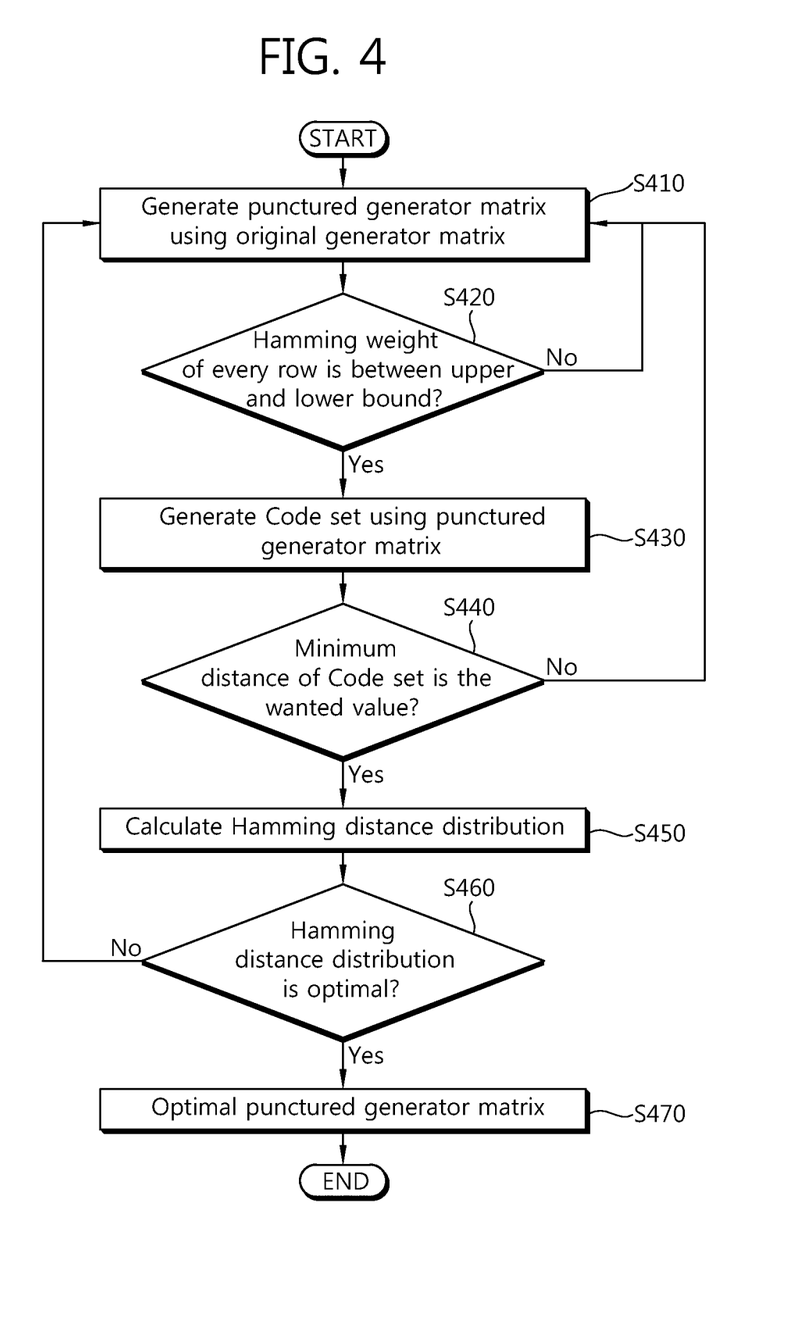
FIG. 4 shows a common puncturing pattern search method.

FIG. 4 shows a common puncturing pattern search method. This method is a search method of reducing the number of times that the Hamming distance distribution of a codeword set is calculated. Here, the Hamming distance refers to a number that values of corresponding bits between a binary code having the same number of bits are not identical with each other.

Referring to FIG. 4, a punctured generating matrix is produced using an original generating matrix (S410). If the Hamming weight of each row is placed between an upper bound value and a lower bound value (S420), a code set is generated using the punctured generating matrix (S430). If not, the process returns to the first step in which a punctured generating matrix is produced.

If the minimum distance of the generated code set is a desired reference value (S440), a Hamming distance distribution is calculated (S450). If not, the process returns to the first step in which a punctured generating matrix is produced.

Whether the Hamming distance distribution is optimal or not (S460). If so, the generating matrix is determined to be an optimized and punctured generating matrix (S470). If not, the process returns to the first step in which a punctured generating matrix is produced.

However, this method is effective when the length of an original RM codeword, that is, a subject of puncturing, is short or the number of rows of a punctured generating matrix is small, but it does not have a search effect because the number of cases of puncturing is too many when the length of the original codeword is long and the number of rows of a punctured generating matrix is large. For example, if the length of an original codeword is 64 and the number of rows to be punctured is 16, the number of possible cases of puncturing is very large, $_{64}C_{16}$=488,526,937,079,580.

In order to puncture rows having a greater length of a codeword or having a larger number of generator matrices, the number of cases of puncturing must be able to be searched for more effectively.

A generating matrix of an (a,A) RM code in which the length of a codeword is a($a=2^n-x$, $x=2^yb$) and the length A of an information bit is any one of 1 to n+1 is generated by puncturing an original generating matrix of an RM code RM(1,n) in which the length of a codeword is $2^n$ and degree is 1. In terms of the characteristics of an RM code, a code sequence generated using a first order vector has better performance than a code sequence generated using a high degree vector of a second order or higher. Thus, only a code sequence generated using only the first order vector may be used. However, the scope of the present invention is not limited thereto, and a high degree vector of a second order or higher may be used.

Accordingly, in a generating matrix of a first order RM code having a ($2^n$,A) parameter, a code sequence is generated by puncturing x rows. Here, the punctured x rows makes best minimum distance performance between the codeword of the (a,A) RM code. Furthermore, if the size A of an information bit is smaller than n+1, A is selected from the n+1 columns. If A is 1, an A×1 matrix in which all elements are 1 becomes a generating matrix, and columns that have best minimum distance performance between codewords are selected for the remaining A.

Since the RM code is a block linear code, two codewords are selected from a code set and they become codewords as a result of an eXclusive OR (XOR) operation. Accordingly, Equation 5 below is established.

$$\forall a,b \in (2^n, A)RM \Rightarrow a \oplus b \in (2^B, A)RM \quad \text{[Equation 5]}$$

Here, $\oplus$ means an XOR operation.

That is, a differential vector between codewords becomes another codeword. Accordingly, a minimum distance between codewords within a code set and a minimum value of the Hamming weight of the codeword within the code set have the same value. The Hamming weight refers to the number of symbols not 0 symbols in a character string.

Furthermore, since all one column exists within a generating matrix, both all zero vector and all one vector have a codeword. Thus, Equation 6 below is established for specific two codewords within the code set.

$$\forall a,b \in (2^n, A)RM \Rightarrow \overline{a \oplus b} = 1 \oplus a \oplus b \in (2^B, A)RM \quad \text{[Equation 6]}$$

Because of the two characteristics of the RM code, a maximum value of the minimum distance between the codewords of the RM code in which the size of an encoded bit is 2e is characterized in e.

If an (a,y+1) code in which the length of a codeword is $a (a=2^n-x, x=2^y b, y=1, 2, \ldots, n)$ and the length of an information bit is y+1 is produced by puncturing a generating matrix of an RM(1,n) code in which the length of a codeword is $2^n$ and order is 1, a $(2^n, y+1)$ RM generating matrix is generated by puncturing. Here, the $(2^n, y+1)$ RM generating matrix G is produced using one all one vector and y first order vectors as rows. The first order vector refers to a vector in which the number of 1 symbols is identical with the number of 0 symbols.

As a simple example, when n=4 and y=3, the generating matrix G is as follows in Equation 7 below.

$$G = \begin{pmatrix} 1 & 1 & 1 & 1 & 1 & 1 & 1 & 1 & 1 & 1 & 1 & 1 & 1 & 1 & 1 & 1 \\ 1 & 1 & 1 & 1 & 1 & 1 & 1 & 1 & 0 & 0 & 0 & 0 & 0 & 0 & 0 & 0 \\ 1 & 1 & 1 & 1 & 0 & 0 & 0 & 0 & 1 & 1 & 1 & 1 & 0 & 0 & 0 & 0 \\ 1 & 1 & 0 & 0 & 1 & 1 & 0 & 0 & 1 & 1 & 0 & 0 & 1 & 1 & 0 & 0 \end{pmatrix} \quad \text{[Equation 7]}$$

This generating matrix may be called an original generating matrix. A generating matrix of an RM code may be produced by performing puncturing from this generating matrix. Here, the matrix G has one all one vector and three first order vectors.

If a $(2^n, y)$ matrix generated by removing the first row from the matrix G generated by a method, such as that of Equation 7, is G', G' has the number of $2^{n-y}$ times of all binary y-tuple vectors as respective columns. The y-tuple vector refers to a vector having y symbols.

For example, if n=4 and y=3, G' becomes a form in which the 3-tuple vector is the number of $2^4$ times, and G' is as follows in Equation 8 below.

$$G' = \begin{pmatrix} 1 & 1 & 1 & 1 & 1 & 1 & 1 & 1 & 0 & 0 & 0 & 0 & 0 & 0 & 0 & 0 \\ 1 & 1 & 1 & 1 & 0 & 0 & 0 & 0 & 1 & 1 & 1 & 1 & 0 & 0 & 0 & 0 \\ 1 & 1 & 0 & 0 & 1 & 1 & 0 & 0 & 1 & 1 & 0 & 0 & 1 & 1 & 0 & 0 \end{pmatrix} \quad \text{[Equation 8]}$$

Here, a $2^{4-3}$ number of $2^3$ types of binary 3-tuple vectors exist in the row of the matrix G'.

For all y—tuple input m' except the all zero vector, a $2^{n-1}$-tuple codeword c' (that is, c'=m'G') generated through the $(2^n, y)$ matrix G' becomes a codeword having 0 and 1 each having a number $2^{n-1}$. Here, a Hamming weight is $2^{n-1}$.

A column added when G' is extended to G is all one row. Therefore, a $2^n$—tuple codeword c (that is, c=mG) generated through the $(2^n, y+1)$ matrix G for all y+1-tuple input m except all zero vector according to the characteristics of G' becomes a codeword in which a Hamming weight having the number $2^{n-1}$ times of 0 and 1 is $2^{n-1}$.

The characteristics of the RM code that may be known from the generating matrix of the RM code is that a codeword set having a Hamming weight of $2^{n-1}$ is produced when the same number of times of all y-tuple vector is repeated form the column of G', that is, the sub-matrix of the $(2^n, y+1)$ generating matrix G. That is, whether a set in which minimum distance performance between the codewords of the RM code is a maximum can be generated from the generating matrix can be known.

A method of generating codewords according to the present invention is described below. In particular, a puncturing search method for generating a generating matrix that generates codewords is described.

Figure 5:
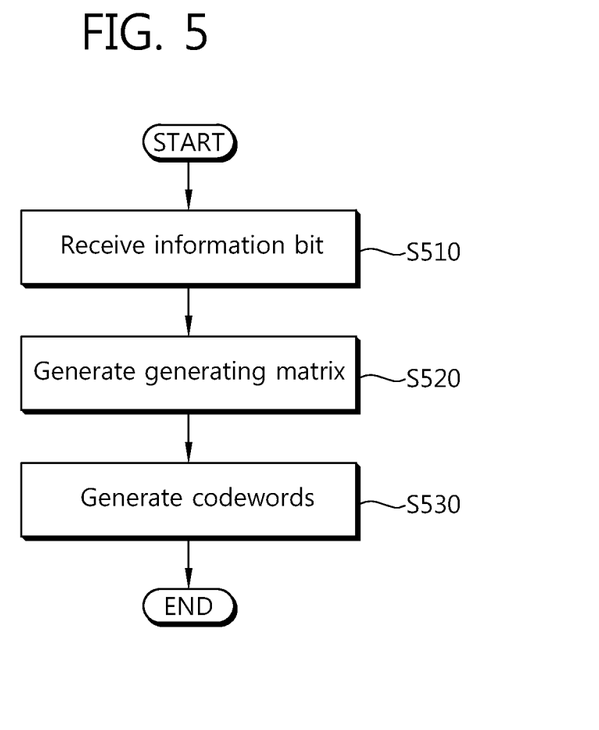
FIG. 5 is a flowchart illustrating a method of generating codewords according to the present invention.

FIG. 5 is a flowchart illustrating a method of generating codewords according to the present invention.

First, an information bit is received (S510). An optimal generating matrix in which the size of a column is identical with the length of the information bit is generated (S520). Detailed contents for generating the optimal generating matrix is described later. Codewords are generated using the optimal generating matrix (S530).

The generating matrix is characterized in that the generating matrix of an RM code is generated by puncturing. In particular, as described above, the optimal generating matrix is generated by puncturing the $(2^n, y+1)$ generating matrix, that is, the original generating matrix G. The length of a codeword is $a(a=2^n-x, x=2^y b, y=1, 2, \ldots, n)$, and the length of the received information bit is y+1. x is the number of punctured columns, and b may be calculated from x and y.

The optimal generating matrix is generated by searching for puncturing through an optimized algorithm and performing corresponding puncturing. Here, the $(2^n, y+1)$ matrix G is produced using one all one vector and y first order vectors as rows.

In order to search for the puncturing of the generating matrix, first, the columns of the original generating matrix G are equally divided into $2^y$. Here, $2^y$ is called a division coefficient. As an embodiment, if the length of the codeword $2^n$ of the original generating matrix G is 32 (that is, n is 5) and a is 20, x is 12, y is 2, and b is 3 in "x=$2^n$-a=12=$2^2$*3". The generating matrix G may be equally divided into $2^2$, that is, 4 equal parts. This is as follows in Equation 9 below.

$$G = \begin{pmatrix} 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 \\ 1 & 1 & 1 & 1 & 1 & 1 & 1 & 1 & 1 & 1 & 1 & 1 & 1 & 1 & 1 & 1 & 0 & 0 & 0 & 0 & 0 & 0 & 0 & 0 & 0 & 0 & 0 & 0 & 0 & 0 & 0 & 0 \\ 1 & 1 & 1 & 1 & 1 & 1 & 1 & 1 & 0 & 0 & 0 & 0 & 0 & 0 & 0 & 0 & 1 & 1 & 1 & 1 & 1 & 1 & 1 & 1 & 0 & 0 & 0 & 0 & 0 & 0 & 0 & 0 \\ 1 & 1 & 1 & 1 & 0 & 0 & 0 & 0 & 1 & 1 & 1 & 1 & 0 & 0 & 0 & 0 & 1 & 1 & 1 & 1 & 0 & 0 & 0 & 0 & 1 & 1 & 1 & 1 & 0 & 0 & 0 & 0 \\ 1 & 1 & 0 & 0 & 1 & 1 & 0 & 0 & 1 & 1 & 0 & 0 & 1 & 1 & 0 & 0 & 1 & 1 & 0 & 0 & 1 & 1 & 0 & 0 & 1 & 1 & 0 & 0 & 1 & 1 & 0 & 0 \end{pmatrix} \quad \text{[Equation 9]}$$

From 2 to y+1 (in the case of the above, 3)$^{th}$ rows except the first row, that is, the all one row of the generating matrix G, it can be seen that all the rows of each section are formed of the same symbols (all 1 symbols or all 0 symbols). Accordingly, the 2 to y+1 (in the case of the above, 3)$^{th}$ rows of each section has a $2^{n-y}$ (in the case of the above, $2^{5-2}$=8 times) number of the same y-tuple vector (in the case of the above, a 2-tuple vector).

b (in the case of the above, 3) columns in the set of each divided matrix are punctured. In this case, the 2 to y+1 (in the case of the above, 3)$^{th}$ rows are the same although specific columns in the divided set are punctured by a b number (in the case of the above, 3). Thus, the 2 to y+1 (in the case of the above, 3)$^{th}$ rows have a $2^{n-y}$-b number (in the case of the above, $2^{5-2}$-3=5) of all y-tuple vector (in the case of the above, a 2-tuple vector). Thus, a generating matrix of an optimal codeword is obtained for an RM code having a 1 to y+1 number of (in the case of the above, 3) of an information bit.

Furthermore, all the codewords generated for a codeword having an information bit of 1 to y+1 are only three types in which a Hamming weight is 0, a/2, and a (in the case of the above, 0, 10, and 20), and thus a Hamming distance distribution between the codewords is the best. Furthermore, the case where a Hamming distance and a Hamming distance distribution between the codewords is optimal does not exist. Accordingly, in order to search for an optimal RM code that supports information bits of 1 to A, all the cases where x columns from among $2^n$ columns of the generating matrix G are punctured are not searched for, but only the case where b columns are punctured for each of the divided $2^y$ sets has only to be searched for.

The number of all cases in which 16 rows from among the 64 columns of the generating matrix G are punctured is $_{64}C_{16}$=488,526,937,079,580, but the cases of $2^{32}$=4,294,967,296 have only to be searched for by applying the search method according to the present invention. Accordingly, a total computational load is reduced to about 1/100,000.

As yet another embodiment of a search method according to the present invention, when generating a generating matrix $G_{48}$=[$(G^0_{48}),(G^1_{48})$] of a punctured RM code in which the length of a codeword is 48 and one of information bits 1 to 5 is applied, matrices, such as those of Equation 10 and Equation 11, are generated.

If column replacement that applies the above-described row replacement to a column is applied to the generating matrix, when a linear operation is applied, the deterioration of performance can be prevented and diversity performance can be efficiently obtained because a zero symbol can be removed to the highest degree.

A method of performing row replacement includes, first, dividing the rows of the generating matrix of a (24,10) code into an upper group and a lower group each including n rows (wherein n may be 12) and making the number of 1s, belonging to each of the n rows in all columns, equal. If the number of 1s belonging to each of the n rows cannot become equal in all columns, the rows of the generating matrix are divided into two groups so that a difference between the numbers of 1s becomes a minimum. Second, the position or order of the rows is controlled so that 0 does not appear consecutively in all the columns in each of the divided groups. Third, if the appearance of consecutive 0s cannot be prevented, the position or order of rows is controlled so that consecutive 0s belong to different symbols when transmitting the consecutive 0s. Fourth, if all the three conditions cannot be satisfied, the rows are aligned again so that the number of consecutive 0s becomes a minimum.

If this is modified by column replacement and then applied to the generating matrix, first, all the rows of the generating matrix are divided into four equal parts and the positions of the second set and the fourth set are exchanged. Accordingly, the number of 1s distributed in the left half of becomes equal to the number of 1s distributed in the right half of the generating matrix.

Next, column replacement is performed so that 0 does not consecutively appear within each of sub-matrices having the sets of a right half and a left half.

If there are consecutive 0s nevertheless, column replacement is performed so that the consecutive 0s belong to another symbol (so that the start of 0 is placed in an odd-numbered column).

As a result, a generating matrix $[G_{48}]_P$=$[(G^0_{48})_P,(G^1_{48})_P]$, such as that of Equation 12 and Equation 13 below, can be generated.

$$G^0_{48} = \begin{pmatrix} 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 \\ 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 \\ 1 & 1 & 1 & 1 & 1 & 1 & 1 & 1 & 1 & 1 & 1 & 1 & 0 & 0 & 0 & 0 & 0 & 0 & 0 & 0 & 0 & 0 & 0 & 0 \\ 1 & 1 & 1 & 1 & 1 & 1 & 0 & 0 & 0 & 0 & 0 & 0 & 1 & 1 & 1 & 1 & 1 & 1 & 0 & 0 & 0 & 0 & 0 & 0 \\ 1 & 1 & 1 & 0 & 0 & 0 & 1 & 1 & 1 & 0 & 0 & 0 & 1 & 1 & 1 & 0 & 0 & 0 & 1 & 1 & 1 & 0 & 0 & 0 \end{pmatrix}$$ [Equation 10]

$$G^1_{48} = \begin{pmatrix} 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 \\ 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\ 1 & 1 & 1 & 1 & 1 & 1 & 1 & 1 & 1 & 1 & 1 & 1 & 0 & 0 & 0 & 0 & 0 & 0 & 0 & 0 & 0 & 0 & 0 & 0 \\ 1 & 1 & 1 & 1 & 1 & 1 & 0 & 0 & 0 & 0 & 0 & 0 & 1 & 1 & 1 & 1 & 1 & 1 & 0 & 0 & 0 & 0 & 0 & 0 \\ 1 & 1 & 1 & 0 & 0 & 0 & 1 & 1 & 1 & 0 & 0 & 0 & 1 & 1 & 1 & 0 & 0 & 0 & 1 & 1 & 1 & 0 & 0 & 0 \end{pmatrix}$$ [Equation 11]

$$(G_{48}^0)_\Gamma = \begin{pmatrix} 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 \\ 1 & 0 & 1 & 0 & 0 & 1 & 0 & 1 & 1 & 0 & 1 & 0 & 0 & 1 & 0 & 1 & 1 & 0 & 1 & 0 & 0 & 1 & 0 & 1 \\ 1 & 0 & 1 & 0 & 0 & 1 & 0 & 1 & 1 & 0 & 1 & 0 & 0 & 1 & 0 & 1 & 1 & 0 & 1 & 0 & 0 & 1 & 0 & 1 \\ 1 & 0 & 0 & 1 & 1 & 0 & 0 & 1 & 1 & 0 & 0 & 1 & 1 & 0 & 0 & 1 & 1 & 0 & 0 & 1 & 1 & 0 & 0 & 1 \\ 0 & 1 & 0 & 1 & 0 & 1 & 0 & 1 & 0 & 1 & 0 & 1 & 0 & 1 & 0 & 1 & 0 & 1 & 0 & 1 & 0 & 1 & 0 & 1 \end{pmatrix}$$ [Equation 12]

$$(G_{48}^1)_\Gamma = \begin{pmatrix} 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 \\ 0 & 1 & 0 & 1 & 1 & 0 & 1 & 0 & 0 & 1 & 0 & 1 & 1 & 0 & 1 & 0 & 0 & 1 & 0 & 1 & 1 & 0 & 1 & 0 \\ 1 & 0 & 1 & 0 & 0 & 1 & 0 & 1 & 1 & 0 & 1 & 0 & 0 & 1 & 0 & 1 & 1 & 0 & 1 & 0 & 0 & 1 & 0 & 1 \\ 1 & 0 & 0 & 1 & 1 & 0 & 0 & 1 & 1 & 0 & 0 & 1 & 1 & 0 & 0 & 1 & 1 & 0 & 0 & 1 & 1 & 0 & 0 & 1 \\ 0 & 1 & 0 & 1 & 0 & 1 & 0 & 1 & 0 & 1 & 0 & 1 & 0 & 1 & 0 & 1 & 0 & 1 & 0 & 1 & 0 & 1 & 0 & 1 \end{pmatrix}$$ [Equation 13]

If codewords are generated using the punctured generating matrix according to the present invention, the following advantages are obtained.

In relation to an information bit size having 1 to y+1 of an RM code in which the length of a codeword is a($=2^n-x$) and x($2^y b$), a generating matrix for generating an RM codeword set that has an optimal Hamming weight distribution can be produced without special operation. Furthermore, in relation to an information bit size greater than y+1 of an RM code in which the length of a codeword is a($=2^n-x$) and x($=2^y b$), a computational load necessary to search for a generating matrix for generating an RM codeword set that has an optimal Hamming weight distribution can be greatly reduced.

Furthermore, performance through diversity can be improved through the column permutation of a generating matrix for obviating a zero symbol.

Figure 6:
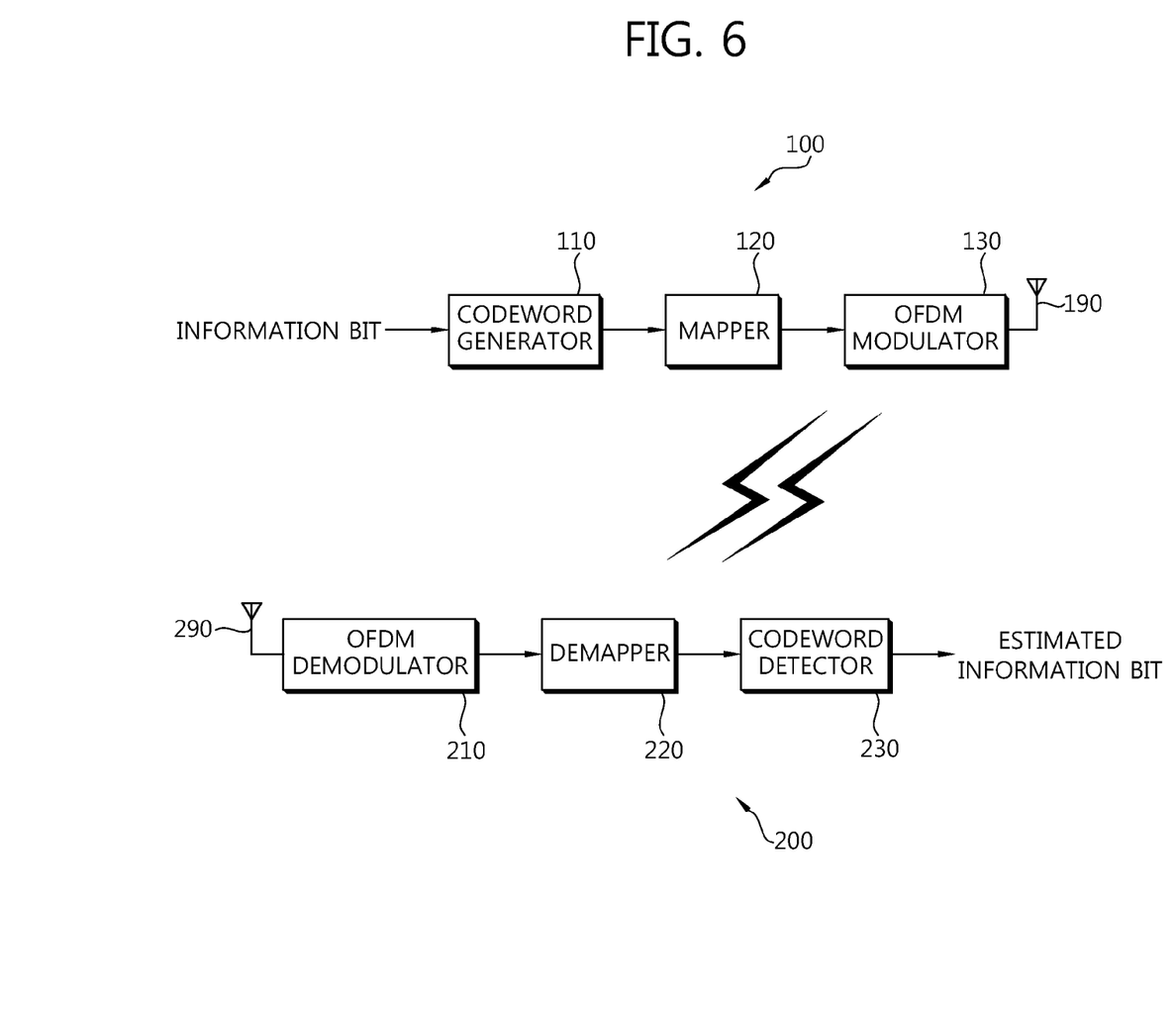
FIG. 6 is a block diagram showing a transmitter and a receiver according to an embodiment of the present invention.

FIG. 6 is a block diagram showing a transmitter and a receiver according to an embodiment of the present invention.

Referring to FIG. 6, the transmitter 100 may include a codeword generator 110, a mapper 120, and an OFDM modulator 130.

The codeword generator 110 generates a codeword using the method of generating codewords according to the present invention described with reference to FIGS. 2 to 5.

The mapper 120 modulates the codeword according to a predetermined modulation method and maps the modulated codeword to symbols that represent positions according to the amplitude and phase constellation. The OFDM modulator 130 transforms received symbols into OFDM symbols. The OFDM modulator 130 may transform the received symbols into time domain samples by performing Inverse a Fast Fourier Transform (IFFT). A Cyclic Prefix (CP) may be added to the transformed time domain samples. The OFDM symbols outputted from the OFDM modulator 130 are transmitted through a transmit antenna 190.

The receiver 200 includes an OFDM demodulator 210, a demapper 220, and a codeword detector 230.

A signal received from a receive antenna 290 is transformed into the symbols of the frequency domain by the OFDM demodulator 210. The OFDM demodulator 210 may remove a CP from the input signal and perform a Fast Fourier Transform (FFT) on the resulting signal. The demapper 220 demaps the received symbols. The codeword detector 230 detects an estimated information bit through the auto-correlation and cross-correlation of a codeword.

The transmitter 100 and the receiver 200 illustrate a Single-Input Single-Output (SISO) method having one transmit antenna and one receive antenna, but the technical spirit of the present invention may be applied to a Multiple-Input Multiple-Output (MIMO) system having a number of transmit antennas and a number of receive antennas without change.

The transmitter 100 and the receiver 200 illustrate a system based on Orthogonal Frequency Division Multiplexing (OFDM)/Orthogonal Frequency Division Multiple Access (OFDMA), but the technical spirit of the present invention may be applied to systems based on other wireless access methods, such as Time Division Multiple Access (TDMA) and Code Division Multiple Access (CDMA), without change.

The foregoing embodiments and advantages are merely exemplary and are not to be construed as bounding the present invention. The present teaching can be readily applied to other types of apparatuses. The description of the foregoing embodiments is intended to be illustrative, and not to bound the scope of the claims. Many alternatives, modifications, and variations will be apparent to those skilled in the art.

The invention claimed is:

1. A method of generating codewords using an encoder, the method comprises the steps of:
   receiving an information bit;
   generating a generating matrix in which a size of a column is identical with a length of the information bit, a size of a row is 24 rows, and values of symbols that are elements of the matrix are 0 or 1;
   modifying the generating matrix by dividing the generated generating matrix into an upper group and a lower group having an identical size and replacing rows so that the number of symbols having a value of 1 in the upper group is identical with the number of symbols having a value of 1 in the lower group; and
   obtaining inner products from the information bit and each row of the modified generating matrix and generating codewords from remainders obtained by dividing the inner products by 2.

2. The method of claim 1, wherein the generating matrix is modified by replacing the rows so that a difference between the number of symbols having the value of 1 in the upper group and the number of symbols having the value of 1 in the lower group becomes a minimum, if the rows are unable to be replaced so that the number of symbols having the value of 1 in the upper group is identical with the number of symbols having the value of 1 in the lower group.

3. The method of claim 1, wherein the generating matrix is modified by replacing the rows so that a symbol having a value of 0 does not consecutively occur in each column of the upper group and the lower group.

4. The method of claim 1, wherein the generating matrix is generated by combining 24 rows selected from 32 rows in a table below and combining columns equal to the length of the information bit.

| i | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ |
|---|---|---|---|---|---|---|---|---|---|---|
| 0 | 1 | 0 | 0 | 0 | 0 | 1 | 0 | 0 | 0 | 0 |
| 1 | 0 | 1 | 0 | 0 | 0 | 1 | 1 | 0 | 0 | 0 |
| 2 | 1 | 1 | 0 | 0 | 0 | 1 | 0 | 0 | 0 | 1 |
| 3 | 0 | 0 | 1 | 0 | 0 | 1 | 1 | 0 | 1 | 1 |
| 4 | 1 | 0 | 1 | 0 | 0 | 1 | 0 | 0 | 0 | 1 |
| 5 | 0 | 1 | 1 | 0 | 0 | 1 | 0 | 0 | 1 | 0 |
| 6 | 1 | 1 | 1 | 0 | 0 | 1 | 0 | 1 | 0 | 0 |
| 7 | 0 | 0 | 0 | 1 | 0 | 1 | 0 | 1 | 1 | 0 |
| 8 | 1 | 0 | 0 | 1 | 0 | 1 | 1 | 1 | 1 | 0 |
| 9 | 0 | 1 | 0 | 1 | 0 | 1 | 1 | 0 | 1 | 1 |
| 10 | 1 | 1 | 0 | 1 | 0 | 1 | 0 | 0 | 1 | 1 |
| 11 | 0 | 0 | 1 | 1 | 0 | 1 | 0 | 1 | 1 | 0 |
| 12 | 1 | 0 | 1 | 1 | 0 | 1 | 0 | 1 | 0 | 1 |
| 13 | 0 | 1 | 1 | 1 | 0 | 1 | 1 | 0 | 0 | 1 |
| 14 | 1 | 1 | 1 | 1 | 0 | 1 | 1 | 1 | 1 | 1 |
| 15 | 1 | 0 | 0 | 0 | 1 | 1 | 1 | 1 | 0 | 0 |
| 16 | 0 | 1 | 0 | 0 | 1 | 1 | 1 | 1 | 0 | 1 |
| 17 | 1 | 1 | 0 | 0 | 1 | 1 | 1 | 0 | 1 | 0 |
| 18 | 0 | 0 | 1 | 0 | 1 | 1 | 0 | 1 | 1 | 1 |
| 19 | 1 | 0 | 1 | 0 | 1 | 1 | 0 | 1 | 0 | 1 |
| 20 | 0 | 1 | 1 | 0 | 1 | 1 | 0 | 0 | 1 | 1 |
| 21 | 1 | 1 | 1 | 0 | 1 | 1 | 0 | 1 | 1 | 1 |
| 22 | 0 | 0 | 0 | 1 | 1 | 1 | 0 | 1 | 0 | 0 |
| 23 | 1 | 0 | 0 | 1 | 1 | 1 | 1 | 1 | 0 | 1 |
| 24 | 0 | 1 | 0 | 1 | 1 | 1 | 1 | 0 | 1 | 0 |
| 25 | 1 | 1 | 0 | 1 | 1 | 1 | 1 | 0 | 0 | 1 |
| 26 | 0 | 0 | 1 | 1 | 1 | 1 | 0 | 0 | 1 | 0 |
| 27 | 1 | 0 | 1 | 1 | 1 | 1 | 1 | 1 | 0 | 0 |
| 28 | 0 | 1 | 1 | 1 | 1 | 1 | 1 | 1 | 1 | 0 |
| 29 | 1 | 1 | 1 | 1 | 1 | 1 | 1 | 1 | 1 | 1 |
| 30 | 0 | 0 | 0 | 0 | 0 | 1 | 0 | 0 | 0 | 0 |
| 31 | 0 | 0 | 0 | 0 | 1 | 1 | 1 | 0 | 0 | 0. |

5. The method of claim 1, wherein the generating matrix is generated by selecting columns equal to the length of the information bit in a table below.

| i | $M_{i,0}$ | $M_{i,1}$ | $M_{i,2}$ | $M_{i,3}$ | $M_{i,4}$ | $M_{i,5}$ |
|---|---|---|---|---|---|---|
| 0 | 1 | 1 | 0 | 0 | 0 | 0 |
| 1 | 1 | 1 | 1 | 0 | 0 | 0 |
| 2 | 1 | 0 | 0 | 1 | 0 | 0 |
| 3 | 1 | 0 | 1 | 1 | 0 | 0 |
| 4 | 1 | 1 | 1 | 1 | 0 | 0 |
| 5 | 1 | 1 | 0 | 0 | 1 | 0 |
| 6 | 1 | 0 | 1 | 0 | 1 | 0 |
| 7 | 1 | 0 | 0 | 1 | 1 | 0 |
| 8 | 1 | 1 | 0 | 1 | 1 | 0 |
| 9 | 1 | 0 | 1 | 1 | 1 | 0 |
| 10 | 1 | 1 | 1 | 1 | 1 | 0 |
| 11 | 1 | 0 | 1 | 0 | 0 | 1 |
| 12 | 1 | 1 | 1 | 0 | 0 | 1 |
| 13 | 1 | 0 | 0 | 1 | 0 | 1 |
| 14 | 1 | 1 | 0 | 1 | 0 | 1 |
| 15 | 1 | 0 | 1 | 1 | 0 | 1 |
| 16 | 1 | 1 | 1 | 1 | 0 | 1 |
| 17 | 1 | 0 | 0 | 0 | 1 | 1 |
| 18 | 1 | 1 | 0 | 0 | 1 | 1 |
| 19 | 1 | 0 | 1 | 0 | 1 | 1 |
| 20 | 1 | 1 | 1 | 0 | 1 | 1 |
| 21 | 1 | 0 | 0 | 1 | 1 | 1 |
| 22 | 1 | 1 | 0 | 1 | 1 | 1 |
| 23 | 1 | 0 | 0 | 0 | 0 | 1. |

6. The method of claim 1, wherein the generating matrix is generated by selecting columns equal to the length of the information bit in a table below.

| i | $M_{i,0}$ | $M_{i,1}$ | $M_{i,2}$ | $M_{i,3}$ | $M_{i,4}$ | $M_{i,5}$ |
|---|---|---|---|---|---|---|
| 0 | 1 | 1 | 0 | 0 | 0 | 0 |
| 1 | 1 | 1 | 1 | 0 | 0 | 0 |
| 2 | 1 | 0 | 0 | 1 | 0 | 0 |
| 3 | 1 | 0 | 1 | 1 | 0 | 0 |
| 4 | 1 | 1 | 1 | 1 | 0 | 0 |
| 5 | 1 | 1 | 0 | 0 | 1 | 0 |
| 6 | 1 | 0 | 1 | 0 | 1 | 0 |
| 7 | 1 | 0 | 0 | 1 | 1 | 0 |
| 8 | 1 | 1 | 0 | 1 | 1 | 0 |
| 9 | 1 | 0 | 1 | 1 | 1 | 0 |
| 10 | 1 | 1 | 1 | 1 | 1 | 0 |
| 11 | 1 | 0 | 1 | 0 | 0 | 1 |
| 12 | 1 | 1 | 1 | 0 | 0 | 1 |
| 13 | 1 | 0 | 0 | 1 | 0 | 1 |
| 14 | 1 | 1 | 0 | 1 | 0 | 1 |
| 15 | 1 | 0 | 1 | 1 | 0 | 1 |
| 16 | 1 | 0 | 0 | 0 | 1 | 1 |
| 17 | 1 | 1 | 0 | 0 | 1 | 1 |
| 18 | 1 | 0 | 1 | 0 | 1 | 1 |
| 19 | 1 | 1 | 1 | 0 | 1 | 1 |
| 20 | 1 | 0 | 0 | 1 | 1 | 1 |
| 21 | 1 | 1 | 0 | 1 | 1 | 1 |
| 22 | 1 | 1 | 1 | 1 | 1 | 1 |
| 23 | 1 | 0 | 0 | 0 | 0 | 1. |

7. The method of claim 1, wherein the generating matrix is generated by selecting columns equal to the length of the information bit in a table below.

| i | $M_{i,0}$ | $M_{i,1}$ | $M_{i,2}$ | $M_{i,3}$ | $M_{i,4}$ | $M_{i,5}$ |
|---|---|---|---|---|---|---|
| 0 | 1 | 1 | 0 | 0 | 0 | 0 |
| 1 | 1 | 1 | 1 | 0 | 0 | 0 |
| 2 | 1 | 0 | 0 | 1 | 0 | 0 |

-continued

| i | $M_{i,0}$ | $M_{i,1}$ | $M_{i,2}$ | $M_{i,3}$ | $M_{i,4}$ | $M_{i,5}$ |
|---|---|---|---|---|---|---|
| 3 | 1 | 0 | 1 | 1 | 0 | 0 |
| 4 | 1 | 1 | 1 | 1 | 0 | 0 |
| 5 | 1 | 1 | 0 | 0 | 1 | 0 |
| 6 | 1 | 0 | 1 | 0 | 1 | 0 |
| 7 | 1 | 0 | 0 | 1 | 1 | 0 |
| 8 | 1 | 1 | 0 | 1 | 1 | 0 |
| 9 | 1 | 0 | 1 | 1 | 1 | 0 |
| 10 | 1 | 1 | 1 | 1 | 1 | 0 |
| 11 | 1 | 0 | 1 | 0 | 0 | 1 |
| 12 | 1 | 1 | 1 | 0 | 0 | 1 |
| 13 | 1 | 0 | 0 | 1 | 0 | 1 |
| 14 | 1 | 1 | 0 | 1 | 0 | 1 |
| 15 | 1 | 0 | 0 | 0 | 1 | 1 |
| 16 | 1 | 1 | 0 | 0 | 1 | 1 |
| 17 | 1 | 0 | 1 | 0 | 1 | 1 |
| 18 | 1 | 1 | 1 | 0 | 1 | 1 |
| 19 | 1 | 0 | 0 | 1 | 1 | 1 |
| 20 | 1 | 1 | 0 | 1 | 1 | 1 |
| 21 | 1 | 0 | 1 | 1 | 1 | 1 |
| 22 | 1 | 1 | 1 | 1 | 1 | 1 |
| 23 | 1 | 0 | 0 | 0 | 0 | 1. |

8. A method of generating codewords from an original generating matrix of a Reed-Muller (RM) code in which a length of a codeword is $2^n$ using an encoder, the method comprises the steps of:
receiving an information bit;
generating an optimal generating matrix in which a size of a column is identical with a length (y) of the information bit;
generating a codeword by using the optimal generating matrix,
wherein the optimal generating matrix is generated by:
calculating a division coefficient, wherein the division coefficient is a square ($2^{y-1}$) of a difference between the length of the information bit of 2 and 1,
calculating a puncturing coefficient (($2^{y-1}$)/($2^n-a$)) that is a ratio of the division coefficient and a difference between a length of a codeword of the RM code and a length of the generated codeword (a), and
puncturing, when rows of the original generating matrix of the RM code are divided into identical sets equal to the division coefficient, specific columns of each of the sets by the puncturing coefficient.

9. The method of claim 8, further comprising the steps of:
dividing the generated generating matrix into sets of rows of a first group and a second group which have an identical size, and
modifying the generating matrix by replacing columns so that a number of symbols having a value of 1 in the first group is identical with a number of symbols having a value of 1 in the second group.

10. The method of claim 9, wherein the generating matrix is modified by replacing the columns so that a difference between the number of symbols having the value of 1 in the first group and the number of symbols having the value of 1 in the second group becomes a minimum, if the columns are unable to be replaced so that the number of symbols having the value of 1 in the first group is identical with the number of symbols having the value of 1 in the second group.

11. The method of claim 9, wherein the generating matrix is modified by replacing the columns so that a symbol having a value of 0 does not consecutively occur in each column of the first group and the second group.

12. The method of claim 11, wherein the generating matrix is modified by replacing the columns so that the columns belong to different symbols when transmitting a symbol having a consecutive value of 0, if a symbol having a value of 0 consecutively appears in each column of the first group and the second group.

* * * * *